United States Patent [19]

Hartemann

[11] 3,835,422

[45] Sept. 10, 1974

[54] SURFACE WAVE FREQUENCY DISCRIMINATOR

[75] Inventor: Pierre Hartemann, Paris, France

[73] Assignee: Thomson-CSF, Paris, France

[22] Filed: Jan. 10, 1973

[21] Appl. No.: 322,544

[30] Foreign Application Priority Data

Jan. 14, 1972 France ............................... 72.1268

[52] U.S. Cl..................... 333/72, 325/349, 325/487, 329/117, 333/30 R

[51] Int. Cl........................... H03h 9/26, H03d 3/26

[58] Field of Search .......... 333/30 R, 71, 72; 310/8, 310/8.1, 9.7, 9.8; 329/177; 325/349, 325/487, 489

[56] References Cited

UNITED STATES PATENTS

| | | | |
|---|---|---|---|
| 3,548,306 | 12/1970 | Whitehouse | 333/30 X |
| 3,626,309 | 12/1971 | Knowles | 329/117 |
| 3,750,027 | 7/1973 | Hartmann | 333/72 X |

*Primary Examiner*—James W. Lawrence
*Assistant Examiner*—Marvin Nussbaum
*Attorney, Agent, or Firm*—Cushman, Darby & Cushman

[57] ABSTRACT

The present invention relates to frequency discriminators. The frequency discriminator in accordance with the invention comprises a pair of surface wave electromechanical filters deposited upon a single substrate; the spectral responses of the filters are offset in frequency and have a triangular profile so that by subtraction of the detected voltages at the output of these filters, an S characteristic is obtained.

9 Claims, 5 Drawing Figures

SURFACE WAVE FREQUENCY DISCRIMINATOR

The present invention relates to frequency discriminators designed in particular for the detection of frequency modulated electrical signals. In known kinds of frequency discriminators, electrical tuned circuits co-operate with diode detection circuits to produce a detected signal whose amplitude varies as linearly as possible as a function of the instantaneous value of the frequency of an applied frequency modulated signal. To obtain the straightest possible detection characteristic, in the given range of frequency modulation, it is necessary to carefully trim the tuned circuits. This adjustment is a delicate one in practice, and may require re-adjustment during the period for which the discriminator is used. To facilitate adjustments, counter discriminators have been more recently developed which do not utilise tuned circuits; however these devices employ quite a large number of active and passive components.

To overcome these drawbacks, the present invention provides for the substitution of the tuned circuits by a combination of surface wave electromechanical filters, which can be manufactured very simply with very high accuracy and also have excellent frequency stability. No adjustments are needed and the discrimination characteristics are perfectly reproducible.

In accordance with the present invention there is provided a surface wave frequency discriminator capable of supplying in response to an incoming signal frequency modulated in a predetermined frequency range, a further signal representative of the instentaneous value of the frequency of said incoming signal, said discriminator comprising: a piezoelectric substrate, first, second, third and fourth sets of interdigitated electrodes deposited onto said substrate, means feeding said incoming signal to said first and second sets for respectively launching along said substrate first and second surface waves, and electrical detector means coupled to said third and fourth sets for delivering said further signal; said third and fourth sets being arranged for respectively receiving said first and second surface waves.

For a better understanding of the present invention, and to show how the same may be carried into effect reference will be made to the ensuing description and the attached figures among which:

Figure 1:
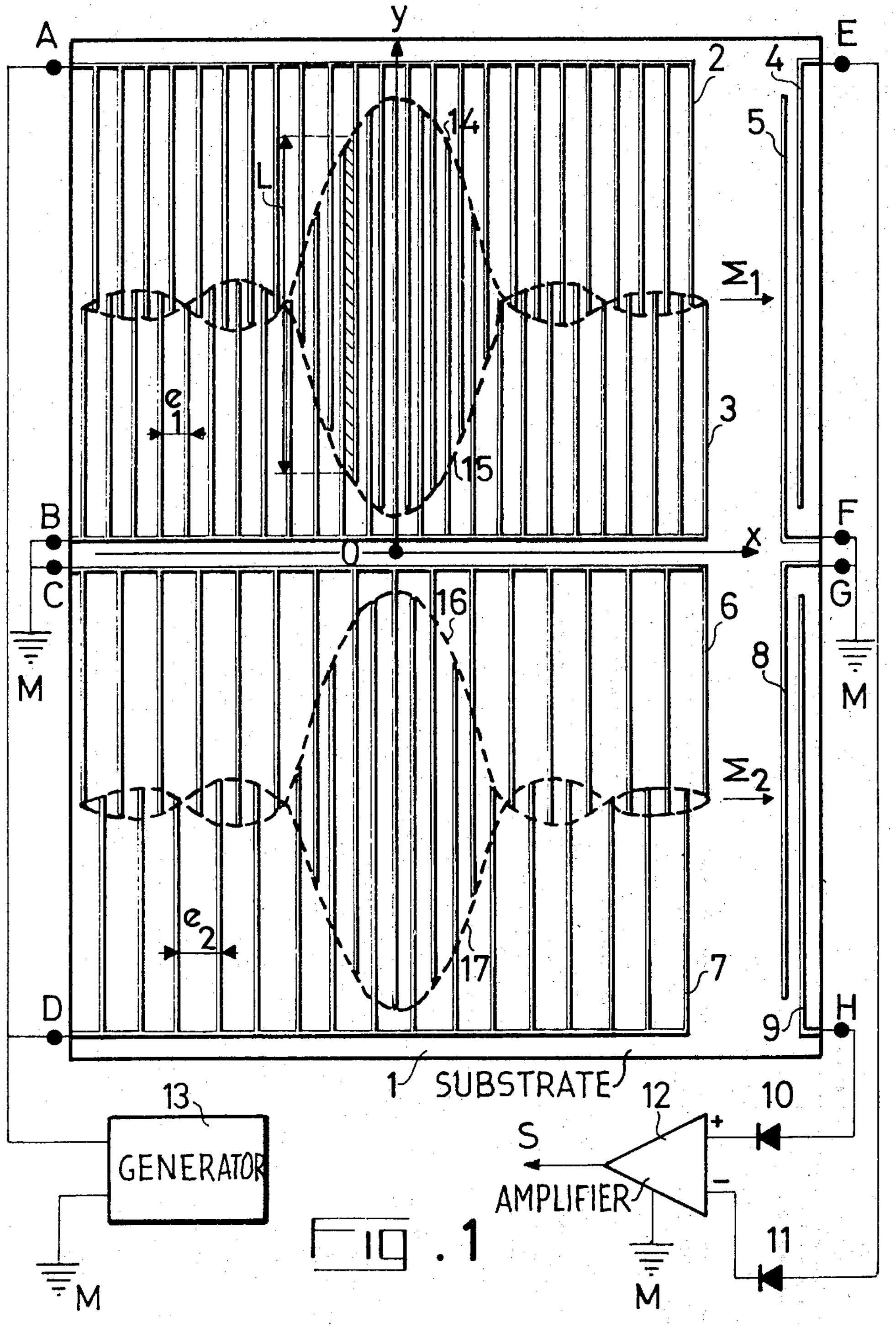
FIG. 1 shows a surface wave frequency discriminator in accordance with the invention.

FIG. 1 shows a substrate of piezoelectric material 1, the top face of which is located in the plane of the figure. On this face, there has previously been deposited a layer of conductive material; certain portions of this layer have been removed by chemical etching, to leave on the substrate nothing but wire-like electrodes in a comb pattern. The two comb arrangements located on the top left-hand area of the substrate, are electrically connected to terminals A and B between which a frequency modulated voltage coming from a generator 13, is applied. These combs have equidistant teeth 2 and 3 interdigitated and disposed perpendicularly to the direction O$x$. The two combs arranged in the top right-hand part of the substrate 1 are electrically connected to terminals E and F and their teeth 4 and 5, which may be more numerous than those of FIG. 1, are interdigitated in the same way as the teeth 2 and 3. The sets of teeth 2 and 3 form, in relation to the substrate 1, an electromechanical transducer, capable of launching a surface wave $\Sigma_1$ which propagates in the direction O$x$ with the propagation velocity C. The surface wave in question may be a Rayleigh wave having a wavelength of $\lambda_1$ substantially equal to the spacing $\theta_1$ or a submultiple thereof.

The wave $\Sigma_1$ is picked up by a transducer which comprises the teeth 4 and 5 and the underlying piezoelectric medium. The output terminals E, F of the transducer supply an alternating voltage induced by the vibrational wave $\Sigma_1$. The assembly of substrate 1 and comb structures 2, 3, 4 and 5, constitutes a surface wave electromechanical filter which can be operated either in the direction O$x$ or in reverse direction. The bottom part of the substrate 1 is equiped with electrodes 6, 7, 8 and 9 which respectively correspond with the electrodes 2, 3, 5 and 8; these elements form a second electromechanical filter between the terminals C, D and G, H. The second filter operates with a surface wave $\Sigma_2$ having a wavelength $\lambda_2$ equal to $\lambda_1$. The spacing $e_2$ of the comb teeth differ slightly from the spacing $e_1$ which is characteristic of the other filter. It will be seen from FIG. 1, that the teeth 3 and 6, as well as the teeth 5 and 8, are externally connected to the electrical earth M of the device; these teeth 3, 6, 5, and 8 can equally well be given a common line, right from the start, simplifying the design of the mask used in the construction of the combs.

The excitation of the waves $\Sigma_1$ and $\Sigma_2$ takes place in portions of the substrate corresponding to the spaces between the consecutive teeth of the interdigitated combs. One of these radiating spaces has been cross-hatched in FIG. 1. The width $L$ of the radiating spaces varies as a function of the abscissa dimension $x$; by way of nonlimitative example, the ends of the spaces will be located upon envelope curves 14, 15, 16 and 17 which delimit the length of the teeth of the transducer combs. In accordance with one of the features of the invention, the mathematical law expressing the width $L$ as a function of the abscissa $x$, is of the kind:

$$L(x) = K\ (\sin kx/kx)^2$$

$K$ and $k$ being constants.

The waves $\Sigma_1$ and $\Sigma_2$ produced by the transducers are radiated from the interior of a highly directional main lobe since the width $L$ of the radiator elements is substantially greater than the wavelength $\lambda$ of the surface waves. The radiation is substantially in the direction O$x$, the cross-talk coupling between the two electromechanical filters, producing no disturbance.

In FIG. 1, the two electromechanical filters supply, through their pairs of terminals EF and GH, rectifier elements 11 and 10 which respectively feed the inputs + and − of a differential amplifier 12. The voltage $V$ available at the output S of the amplifier 12 takes the form $V = V_0\ (|V_1| - |V_2|)$, where $V_0$ is a constant and $|V_1|$ and $|V_2|$ are the moduli of the alternating voltages $V_1$ and $V_2$ respectively present between the pairs of terminals EF and GH.

The function of the discriminator shown in FIG. 1 is determined by the law of variation of the width $L$ of the radiator elements and their spacing along the axis O$x$. The law of variation, in other words, governs the transient response of each filter, from which, by Fourier transform, it is possible to derive the spectral responses. The spectral responses are triangular and, by subtraction, lead to the S curve of the frequency discriminator.

Figure 2:
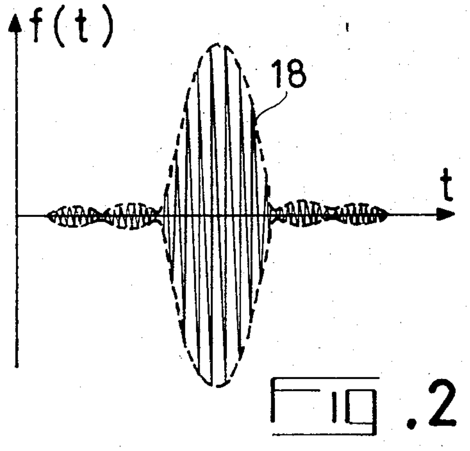
FIGS. 2, 3 and 4 are explanatory figures.

Considering the top electromechanical filter of the substrate 1, it will be seen that a short excitation at a frequency $F_1$, for which the propagated wavelength is equal to $e_1$ or a sub-multiple thereof, leads to a transient $f(t)$ of the kind illustrated in the time-based diagram of FIG. 2. This response is a sinusoidal wave of frequency $F_1$ whose modulation envelope 18 reproduces the law of variation of the width $L$ of the radiating strips, as defined hereinbefore. This correspondence results from the fact that the time scale is related to the length scale by the wellknown relationship $x = ct$. In addition, it has to be remembered that the vibrational energy radiated by a radiating element is proportional to its length $L(x)$.

The Fourier transform formula which enables the spectral response $\Phi(\nu)$ to be derived from the transient response $f(t)$, is:

$$\Phi(\nu) = \int_{-\infty}^{+\infty} f(t) \cdot e^{-j2\pi\nu t} dt$$

Figure 3:
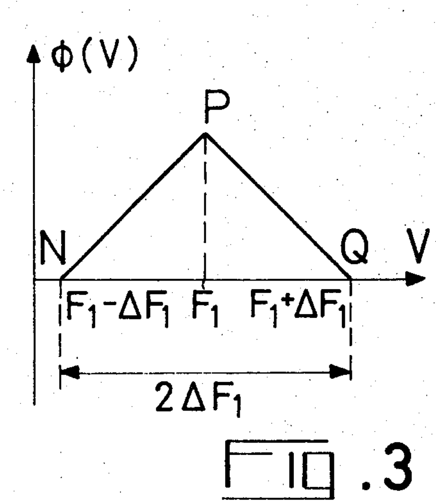

If this classic relationship is applied, then the spectral response shown in the diagram of FIG. 3 is obtained, this diagram plotting the frequency $\nu$ on the abscissa. The spectral response is an Isosceles triangle whose sides NP and PQ represent a linear variation of the alternating amplitude transmitted at frequency $\nu$. The range of frequencies giving rise to a spectral response is between the limit $F_1 - \Delta F$ and $F_1 + \Delta F_1$; $F_1$ is the center frequency hereinbefore defined and $\Delta F_1$ is equivalent to half the passband of the electromechanical filter.

If the parameters $C$, $F_1$ and $\Delta F_1$ are introduced into the general relationships which geometrically define the transducer combs, then we obtain:

$e_1 \approx \alpha \cdot C/F_1$ where $\alpha$ is a whole number and $L(x) \approx K (\sin \pi \cdot \Delta F_1 \cdot x/C / \pi \Delta F_1 \cdot x/C)^2$ These latter relationships likewise apply to the second electromechanical filter, substituting of course for $e_1$, $F_1$ and $\Delta F_1$, the quantities $e_2$, $F_2$ and $\Delta F_2$ which are defined in the same way.

Figure 4:
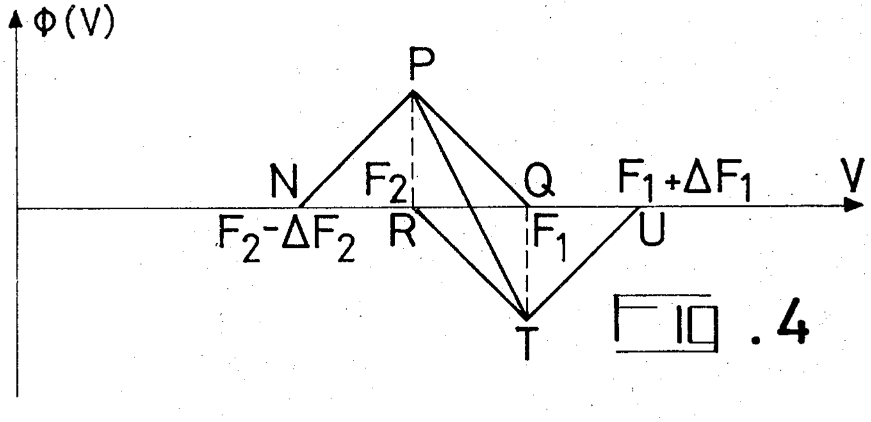

In accordance with another feature of the invention, the two electromechanical filters of the substrate 1, have spectral responses which are offset in frequency from one another, as the diagram $\Phi(\nu)$ of FIG. 4 shows. In this amplitude-frequency diagram, the spectral response of the first electromechanical filter is represented below the frequency axis $\nu$, by the triangular Isosceles profile RTU; the spectral response of the second electromechanical filter is drawn above the axis $\nu$, and has the form of a triangular Isosceles profile NPQ. This arrangement preferentially, too, provides for the center frequency $F_2$ of the second filter to coincide with the limit $F_1 - \Delta F_1$ of the transmission band of the first filter, and for the triangles NPQ and RTU to be equal.

Under these conditions, the law of variation governing the difference between the amplitudes transmitted by the two filters, is represented by the broken line NPTU which constitutes the S-cruve of the frequency discriminator in accordance with the invention. It will be observed that the useful discrimination range is the projection on to the axis $\nu$ of the intermediate segment PT of the S- curve, that is to say the frequency range within which the two spectral responses vary linearly in opposite directions.

The frequency shift between the spectral responses is equal, considering FIG. 4, to the difference between the center frequencies $F_1$ and $F_2$; it is also equal to the discrimination range and to half the transmission band width of the filters. Thus, a frequency discriminator has been produced whose center frequency is $F_0 = F_1 + F_2/2$ and whose discrimination range is $\Delta F = F_1 - F_2$. It goes without saying that it is possible to depart from the conditions shown in FIG. 4, in particular the spectral responses of the two filters being moved further apart or again closer together.

As far as the detector circuits following the two surface wave electromechanical filters are concerned, any two-input single output circuit of the kind already utilized in discriminators with tuned circuits, can be employed.

Figure 5:
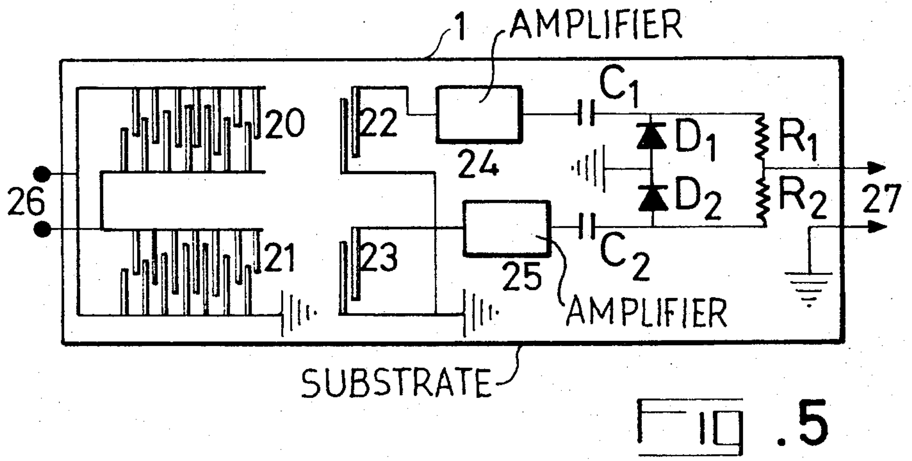
FIG. 5 illustrates a variant embodiment of a discriminator in accordance with the invention.

In FIG. 5, a variant embodiment of the discriminator shown in FIG. 1 can be seen. The substrate is a piezoelectric wafer 1 carrying transducer combs 20, 22, 21 and 23; these form two electromechanical filters with offset triangular spectral responses, having a common input 26 to which the variable frequency signal it is desired to demodulate, is applied. The rectangles 24 and 25 represent integrated structure amplifiers designed, if required, to amplify the alternating signals produced respectively by the transducer combs 22 and 23. The amplifiers 24 and 25 supply detector networks comprising a capacitor $C_1$ and a diode $D_1$ in one case, and a capacitor $C_2$ and a diode $D_2$ in the other. These components can equally well be integrated into the substrate as also can be identical load resistors $R_1$ and $R_2$. The junction between the resistors $R_1$ and $R_2$, and the common earth, constitute the output terminals 27 of the discriminator.

Each detector network produces, across its load resistor, a current the intensity of which varies proportionally to the amplitude of the alternating voltage transmitted by the electromechanical filter to which it is connected. In view of the direction of connection of the diodes $D_1$ and $D_2$, the current flowing through $R_1$ goes to output whilst the current flowing through $R_2$ is branched off; the resulted output current is thus equal to the difference between the detected currents.

It is possible to invert the functions or positions of the transducers 20 and 22 without changing the operation of the discriminator. It is not necessary for the directions of propagation of the surface waves in each of the two filters to be parallel; they could be arranged so that their propagation axes were perpendicular to one another, making it possible to reduce the risk of crosstalk to the maximum extent. If the voltage produced by the transducers exceed the conduction threshold of the diodes $D_1$ and $D_2$ to a sufficient extent, the amplifiers 24 and 25 can be dispensed with. Impedance-matching transformers can likewise be substituted for the amplifiers, to increase the voltage applied to the diode detectors.

What I claim is:

1. A surface wave frequency discriminator capable of supplying in response to an incoming signal frequency modulated in a predetermined frequency range, a further signal representative of the instantaneous value of the frequency of said incoming signal, said discriminator comprising: a piezoelectric substrate, first, second, third and fourth sets of interdigitated electrodes deposited onto said substrate, means feeding said incoming signal to said first and second sets for respectively launching along said substrate first and second surface waves and electrical detector means coupled to said third and fourth sets for delivering said further signal; said third and fourth sets being arranged for respectively receiving said first and second surface waves; said first and third sets cooperating with said substrate for forming a first electromechanical filter; said second and fourth sets cooperating with said substrate for forming a second electromechanical filter; the spectral responses of said first and second filters having substantially triangular profiles; said spectral responses being shifted in frequency in relation to one another for providing a common range of frequencies wherein are located an incrèasing portion of one of said profiles and a decreasing portion of the other of said profiles.

2. A frequency discriminator as claimed in claim 1, wherein each one of said sets comprises two comb shaped electrodes; the teeth of said comb shaped electrodes being interdigitated, evenly spaced and parallel to one another; said wave being launched along a direction substantially perpendicular to the direction of said teeth.

3. A frequency discriminator as claimed in claim 2, wherein at least one set of interdigitated electrodes pertaining to each of said first and second filters provides an array of evenly spaced and parallel radiating strips; the width of said strips being substantially proportional to $(\sin kx/kx)^2$; $k$ being a constant and $x$ the coordinate value along the axis of said array.

4. A frequency discriminator as claimed in claim 1, wherein said common range of frequencies is located between the summits of said profiles.

5. A frequency discriminator as claimed in claim 1, wherein said profiles have substantially equal increasing and decreasing slopes.

6. A frequency discriminator as claimed in claim 1, wherein said electrical detector means comprise first and second detectors respectively coupled to the outputs of said first and second filters, and transmission means delivering a signal proportional to the difference of the detected voltages respectively supplied from said first and second detectors.

7. A frequency discriminator as claimed in claim 2, wherein one of the comb shaped electrodes pertaining to one of said sets, and one of the comb shaped electrodes pertaining to another of said sets have a common edge.

8. A frequency discriminator as claimed in claim 6, wherein voltage boosting means are respectively inserted between the outputs of said first and second filters and the inputs of said first and second detectors.

9. A frequency discriminator as claimed in claim 6, wherein said first and second detectors are diode detectors respectively delivering a positive and a negative rectified voltage; said transmission means comprising two resistors of equal values having a common terminal; the other terminals of said resistors being respectively connected to the outputs of said first and second detectors.

* * * * *